United States Patent [19]

Wulff

[11] Patent Number: 4,547,795
[45] Date of Patent: Oct. 15, 1985

[54] LEADLESS CHIP CARRIER WITH FRANGIBLE SHORTING BARS

[75] Inventor: Richard W. Wulff, Riverside, Calif.

[73] Assignee: Bourns, Inc., Riverside, Calif.

[21] Appl. No.: 478,591

[22] Filed: Mar. 24, 1983

[51] Int. Cl.$^4$ ............... H01L 23/14; H01L 23/48; H01L 23/12
[52] U.S. Cl. ............... 357/80; 357/70; 357/68
[58] Field of Search ............... 357/70, 80, 75; 174/52 FP

[56] References Cited

U.S. PATENT DOCUMENTS

| | | | |
|---|---|---|---|
| 3,483,308 | 12/1969 | Wakely | 357/80 |
| 3,548,494 | 12/1970 | Haring | 357/74 |
| 3,601,522 | 8/1971 | Lynch | 174/68.5 |
| 3,641,401 | 2/1972 | Lynch | 357/74 |
| 3,665,592 | 5/1972 | Apospors | 357/70 X |
| 3,820,152 | 6/1974 | Booth | 357/75 |
| 3,999,285 | 12/1976 | Lewis et al. | 29/588 |
| 4,141,712 | 2/1979 | Rogers | 65/36 |
| 4,288,841 | 9/1981 | Gogal | 357/70 |
| 4,362,902 | 12/1982 | Grabbe | 174/52 FP |

FOREIGN PATENT DOCUMENTS

| | | | |
|---|---|---|---|
| 0087469 | 7/1980 | Japan | 357/70 |
| 0015263 | 1/1983 | Japan | 357/70 |
| 2079534 | 1/1982 | United Kingdom | 357/70 |

Primary Examiner—Andrew J. James
Assistant Examiner—Sheila V. Clark
Attorney, Agent, or Firm—Howard J. Klein; William G. Becker

[57] ABSTRACT

An integrated circuit semiconductor chip or the like is packaged on a leadless chip carrier. The chip carrier comprises a substrate with an integral coplanar extension frangibly connected to one or more sides. Each such extension has a metallized conductive area forming a shorting bar, interconnecting at least some of the metallized conductive traces formed on the substrate. The extensions with the shorting bars remain attached to the substrate while the chip is being installed to prevent damage to the chip from electrostatic discharges. After chip installation is completed, the extensions are separated from the substrate, thereby removing the interconnections between the traces. In a preferred embodiment, a scoring line along the peripheral edge of the substrate provides the frangible connection to the extension, and the extension is provided with holes along the scoring line to allow side metallization of the substrate.

5 Claims, 5 Drawing Figures

LEADLESS CHIP CARRIER WITH FRANGIBLE SHORTING BARS

CROSS-REFERENCE TO RELATED APPLICATION

This application is related to my co-pending application, entitled "Leadless Chip Carrier with Flush Side Metallizations", Ser. No. 478,582; filed Mar. 24, 1983; and commonly assigned herewith.

BACKGROUND OF THE INVENTION

This invention relates to the field of ceramic chip carriers for semiconductor chips, and particularly to such carriers of the so-called "leadless" variety.

It has become common practice in the microelectronics art to package a silicon chip integrated circuit ("chip") in a recess formed in a surface of a ceramic substrate. A plurality of electrical leads are formed onto the substrate surface, as by masking or screen printing, to provide conductive paths between the terminals of the integrated circuit and external contacts. One type of ceramic substrate with its metallized conductive leads terminating at the four sides of the substrate is commonly referred to as a "chip carrier".

One specific chip carrier design which is becoming increasingly popular is the so-called "leadless" carrier, an example of which is disclosed in U.S. Pat. No. 4,288,841 to Gogal. This type of carrier lacks discrete external leads for providing electrical paths from the metallized internal leads or "traces" on the substrate surface. Rather, these metallized traces are continued along the side edges of the substrate to provide side metallizations which are contacted by contact members in a socket. As shown in the aforementioned Gogal patent, these side metallizations are provided in vertical grooves or "castellations" formed in the peripheral edges of the substrate.

The use of leadless chip carriers has been limited, however, by a lack of any inherent means for the prevention of damage to the chip from static electricity during installation of the chip in the carrier, a phenomenon known as "zapping". Leaded carriers avoid this problem by use of lead frames in which the lead members are interconnected by a frame member called a "tie bar" or "shorting bar", which provides a shunt for static discharge induced currents. The shorting bar is then removed when installation and burn-in of the chip are completed. See, for example, U.S. Pat. No. 3,999,285 to Lewis et al.; U.S. Pat. No. 4,141,712 to Rogers; and U.S. Pat. No. 4,362,902 to Grabbe. Leadless carriers, however, lack a lead frame structure with which conventional shorting bars can be used, and no suitable substitute has been available.

Thus, it would be advantageous to provide some means, in a leadless chip carrier package, for reducing or eliminating the hazard of "zapping" the chip. It would also be advantageous to provide such protection in a manner which is easily adaptable to the mass production techniques employed in fabricating such devices.

SUMMARY OF THE INVENTION

Broadly, the present invention comprises a leadless chip carrier on a substrate having frangible extensions bearing printed conductive elements which interconnect the printed traces on the substrate surface, thereby acting as shorting bars. After the chip has been installed and assembly of the chip package completed, the frangible extensions, or "wings", are simply snapped off. In a preferred embodiment, the main body of the chip carrier substrate is rectangular or square, and the extensions are coplanar with the main body and joined to each side of the main body along a straight edge defined by a score line. Separation of the extensions thus leaves the substrate with straight, flat side edges.

If side metallizations are desired, the extensions can be provided with holes contiguous with the score line and edge of the main body, so that conductive material can be drawn through the holes and down the side of the substrate body to form the side metallizations. Side metallizations formed in this manner will thus be flush against a contiguous flat side surface, as described in my above-referenced, co-pending application.

As will be appreciated from the detailed description which follows, the present invention offers a solution to the problem of chip zapping which is convenient, economical, and easily adapted to mass production techniques. In addition, the present invention is compatible with the improved side metallization structure described in my above-referenced, co-pending application.

DETAILED DESCRIPTION OF A PREFERRED EMBODIMENT

Figure 1:
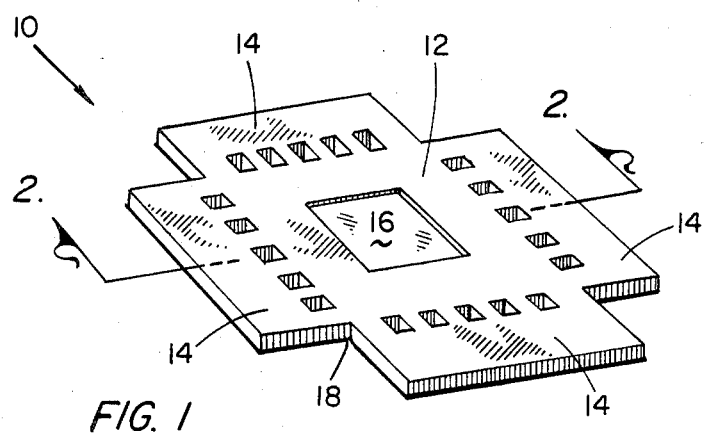
FIG. 1 is a perspective view of a substrate for a chip carrier in accordance with the present invention, prior to printing of the conductive elements thereon.
Figure 2:
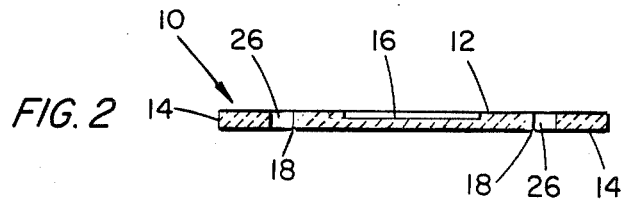
FIG. 2 is a cross-sectional view along line 2—2 of FIG 1.

Referring first to FIGS. 1 and 2, a chip carrier in accordance with the present invention is formed on a flat plate or substrate 10, made of a suitable ceramic, such as alumina. The substrate 10 comprises a main body 12, preferably rectangular, and a plurality of integral extensions or wings 14, one of said wings extending preferably from each side of the main body 12, and coplanar with it. Centrally located on one of the major surfaces of the substrate main body 12, i.e., the top surface, is a recess 16, usually rectangular or square.

Figure 4:
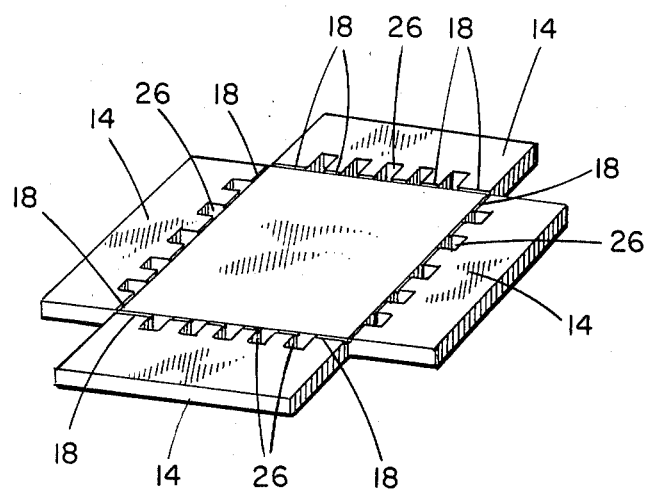
FIG. 4 is a perspective view of a completed chip carrier in accordance with the present invention, showing the bottom surface thereof.

The wings 14 are each joined to the main body 12 along a score line 18, as shown in FIG. 4. These score lines 18 are formed in one or both of the major surfaces of the substrate 10, preferably the bottom surface, and they may either be mechanically scored into the "green" (unfired) ceramic, or laser-scribed into the substrate after firing. In either case, the score lines 18 provide a frangible juncture for the wings 14, so that they can be separated from the main body 12 long a straight edge, as will be described below.

Figure 3:
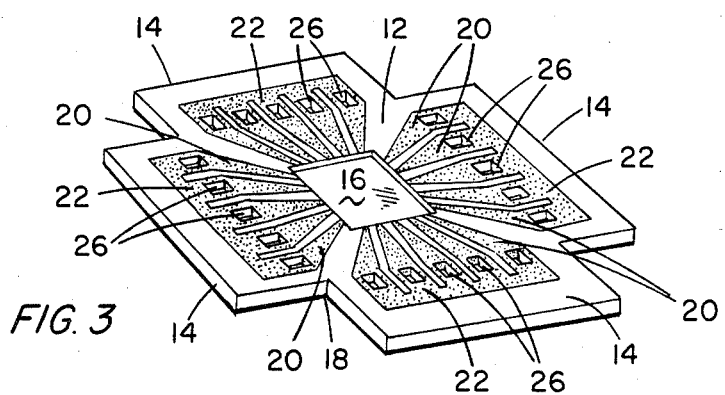
FIG. 3 is a perspective view of a completed chip carrier, in accordance with the present invention, prior to installation of the integrated circuit chip showing the top surface thereof.
Figure 5:
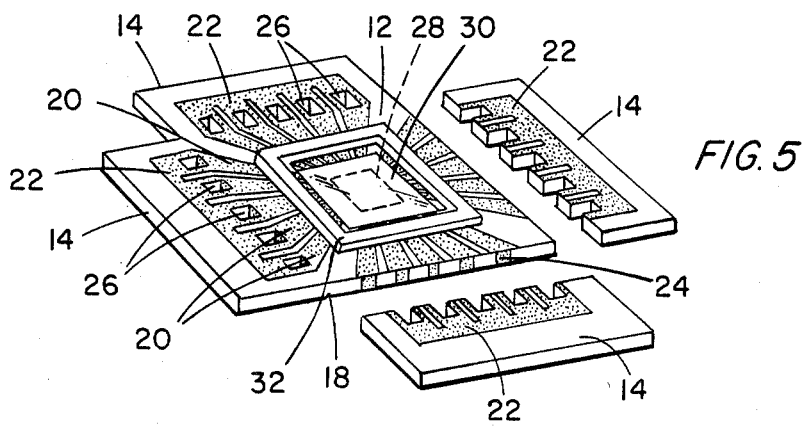
FIG. 5 is a perspective view of the chip carrier of FIG. 3, with the chip installed, and with the shorting barcarrying substrate extensions being separated from the main body of the substrate.

Referring now to FIGS. 3 and 5, emanating outwardly from the recess 16 is a plurality of conductive paths or traces 20, formed by conventional screen printing or masking techniques. The traces 20 extend to the outer edges of the main substrate body 12; that is, to the score lines 18. At the score lines 18, the traces 20 connect to tie bars or shorting bars 22, formed on the wings 14 at the same time, and with the same process, as the traces 20 themselves. While the preferred embodiment shown in the drawings has a separate and discrete shorting bar 22 on each wing 14, in some applications it may be desirable to interconnect the shorting bars on adjacent wings.

In the preferred embodiment illustrated in the drawings, side metallizations 24 (FIG. 5) can be formed on the sides of the main substrate body 12. This is accomplished through a multitude of holes 26 formed through the wings 14 bordering on the score lines 18. With the holes 26 so located, the side metallizations 24 will be formed substantially flush against substantially flat, contiguous surfaces along the sides of the substrate main body 12. (This feature is described more fully in my above-mentioned co-pending application entitled "Leadless Chip Carrier with Flush Side Metallizations".) Thus, the carrier will have side metallizations 24 in registry with the holes 26.

FIG. 3 shows the chip carrier prior to the installation of an integrated circuit chip, while FIG. 5 shows a completed package for such a chip, with the chip (indicated in phantom and referenced by the numeral 28) installed in the recess 16. Electrical connections (not shown) are made between terminals on the chip and the inner ends of the traces 20. The chip 28 is protected by an adhesively attached lid or cover 30 and, frequently, by a frame element 32 surrounding the recess 16.

During installation of the chip 28, the wings 14, with their shorting bars 22, remain attached to the substrate main body 12. Because the shorting bars 22 interconnect the conductive traces 20, electrostatic discharges striking the substrate are shunted harmlessly around the chip 28. When chip installation and burn-in are completed, the wings 14 are simply snapped off at the score lines 18, as shown in FIG. 4, leaving the finished chip package with straight, flat side edges.

Various modifications of the preferred embodiment will suggest themselves to those skilled in the pertinent arts. For example, the holes 26 may be omitted where side metallizations are not desired. Alternatively, conventional castellated side metallizations can be provided by making the holes at least partially into the substrate main body 12, i.e., straddling the score lines 18. These and other modifications should be considered within the scope of the present invention.

It will be appreciated from the foregoing that the present invention provides a convenient and inexpensive solution to the problem of chip "zapping" in leadless chip carriers. It will also be apparent that the present invention is readily adaptable to mass production techniques, as well as to a wide variety of chip carrier configurations.

What is claimed is:

1. A packaged semiconductor device, of the type having an semiconductor chip installed on a ceramic substrate, said substrate having a main body portion bounded by a plurality of peripheral edges, and a plurality of conductive paths on a major surface of said main body portion, each of said paths extending from the proximity of said chip to an end located at one of said peripheral edges, wherein the improvement comprises:

a substrate extension portion formed as an integral part of said substrate and having a surface substantially coplanar with said major surface, said extension portion extending from and frangibly joined to said substrate main body portion along an adjacent one of said peripheral edges to which at least two of said conductive paths extend; and conductive means on said surface of said extension portion and interconnecting the ends of at least two of said conductive paths located at said adjacent peripheral edge, said conductive means being substantially coplanar with said interconnected ends of said conductive paths;

whereby said conductive means is separable from said interconnected paths when the underlying substrate extension portion is frangibly separated from said substrate main body portion along said adjacent peripheral edge.

2. The packaged semiconductor device of claim 1, wherein said conductive means on said surface of said extension portion joins all of the ends of said conductive paths located adjacent said peripheral edge between said extension portion and said substrate main body portion.

3. The packaged semiconductor device of claim 1, further comprising:

means for facilitating the separation of said extension portion from said substrate main body portion along said adjacent peripheral edge.

4. The packaged semiconductor device of claim 3, wherein said separation facilitating means comprises a score line along said adjacent peripheral edge.

5. The packaged semiconductor device of claim 3, wherein at least some of said conductive paths extend onto a surface of a peripheral edge to form a side metallization thereon, and wherein said extension portion is connected to said side metallized edge and includes a plurality of holes along said side-metallized edge in registry with said side metallization.

* * * * *